(12) United States Patent
Fazeli Chaghooshi et al.

(10) Patent No.: US 11,398,842 B2
(45) Date of Patent: Jul. 26, 2022

(54) CONVOLUTIONAL PRECODING AND DECODING OF POLAR CODES

(71) Applicant: The Regents of the University of California, Oakland, CA (US)

(72) Inventors: Arman Fazeli Chaghooshi, San Diego, CA (US); Alexander Vardy, Escondido, CA (US); Hanwen Yao, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/322,564

(22) Filed: May 17, 2021

(65) Prior Publication Data

US 2021/0273659 A1    Sep. 2, 2021

Related U.S. Application Data

(62) Division of application No. 16/892,068, filed on Jun. 3, 2020, now Pat. No. 11,012,100.
(Continued)

(51) Int. Cl.
*H03M 13/29* (2006.01)
*H03M 13/41* (2006.01)
(Continued)

(52) U.S. Cl.
CPC ..... *H03M 13/2933* (2013.01); *H03M 13/235* (2013.01); *H03M 13/2939* (2013.01);
(Continued)

(58) Field of Classification Search
CPC ......... H03M 13/2933; H03M 13/4115; H03M 13/2939; H04L 1/0065
See application file for complete search history.

(56) References Cited

U.S. PATENT DOCUMENTS

| 11,012,100 B2 * | 5/2021 | Fazeli Chaghooshi ..................... H03M 13/6502 |
| 2003/0165199 A1 | 9/2003 | Huang |

(Continued)

OTHER PUBLICATIONS

Afisiadis, O. et al., "A low-complexity improved successive cancellation decoder for polar codes," In Proceedings of IEEE Asilomar Conference on Signals, Systems and Computers, vol. 48, pp. 2116-2120, 2014.
(Continued)

*Primary Examiner* — Joseph D Torres
(74) *Attorney, Agent, or Firm* — Perkins Coie LLP

(57) ABSTRACT

Devices, systems and methods for convolutional precoding and decoding of polar codes are disclosed. An example method for error correction in a data processing system includes receiving a noisy codeword, the codeword having been generated based on an outer stream decodable code and an inner polar code and provided to a communication channel or a storage channel prior to reception by the decoder, the stream decodable code characterized by a trellis, and performing, based on the trellis, a list-decoding operation on the noisy codeword vector to generate a plurality of information symbols, the list-decoding operation being configured to traverse through a plurality of states at one or more stages of a plurality of decoding stages.

20 Claims, 4 Drawing Sheets

Related U.S. Application Data

(60) Provisional application No. 62/856,646, filed on Jun. 3, 2019.

(51) Int. Cl.
  H03M 13/00 (2006.01)
  H04L 1/00 (2006.01)
  H03M 13/23 (2006.01)

(52) U.S. Cl.
  CPC ...... H03M 13/4115 (2013.01); H03M 13/611 (2013.01); H04L 1/0065 (2013.01)

(56) References Cited

U.S. PATENT DOCUMENTS

| | | | |
|---|---|---|---|
| 2011/0113300 A1* | 5/2011 | Murakami | H03M 13/118 714/752 |
| 2014/0019820 A1 | 1/2014 | Vardy et al. | |
| 2014/0040214 A1 | 2/2014 | Ma | |
| 2014/0208183 A1 | 7/2014 | Mahdavifar et al. | |
| 2017/0353269 A1* | 12/2017 | Lin | H04L 1/0061 |
| 2018/0198560 A1 | 7/2018 | Jiang et al. | |
| 2019/0020447 A1* | 1/2019 | Tan | H04L 1/0065 |
| 2019/0108093 A1* | 4/2019 | Presman | G11C 29/52 |
| 2019/0158226 A1* | 5/2019 | Hui | H03M 13/13 |
| 2019/0268106 A1* | 8/2019 | Chen | H04L 1/0057 |
| 2020/0177211 A1 | 6/2020 | Chaghooshi et al. | |
| 2021/0367620 A1* | 11/2021 | Chaghooshi | H03M 13/2933 |

OTHER PUBLICATIONS

Arikan, E. "Channel polarization: A method for constructing capacity achieving codes for symmetric binary-input memoryless channels," IEEE Transactions on Information Theory, vol. 55, No. 7, pp. 3051-3073, 2009.

Balatsoukas-Stimming, A. et al., "LLR-based successive cancellation list decoding of polar codes," IEEE Transactions on Signal Processing, vol. 63, No. 19, pp. 5165-5179, 2015.

Chiu, M. et al., "Reduced-complexity SCL decoding of multi-CRCaided polar codes," arXiv preprint arXiv:1609.08813, 2016.

Condo, C. et al., "Improved successive cancellation flip decoding of polar codes based on error distribution," In Proceedings of IEEE Wireless Communications and Networking Conference Workshops (WCNCW), pp. 19-24, 2018.

Ercan, F. et al., "Partitioned successive-cancellation flip decoding of polar codes", In Proceedings of IEEE International Conference on Communications (ICC), pp. 1-6, 2018.

Fazeli, A. et al., "Viterbi-aided successive-cancellation decoding of polar codes," In Proceedings of IEEE Global Communications Conference (GLOBECOM), pp. 1-6 2017.

Ferris, A.J. et al., "Convolutional Polar Codes," arXiv preprint arXiv:1704.00715. Apr. 3, 2017.

Guo, J. et al., "Enhanced belief propagation decoding of polar codes through concatenation," In Proceedings of IEEE International Symposium on Information Theory (ISIT), pp. 2987-2991, 2014.

Hashemi, S.A. et al. "Partitioned list decoding of polar codes: Analysis and improvement of finite length performance," In proceedings of IEEE Global Communications Conference (GLOBECOM), pp. 1-7, 2017.

Hashemi, S.A., et al., "Partitioned successive-cancellation list decoding of polar codes," In Proceedings of IEEE International Conference on Acoustics, Speech and Signal Processing (ICASSP), pp. 957-960, 2016.

Heller, J.A. et al., "Decoding for satellite and space communication," IEEE Transactions on Communication Technology, vol. 19, No. 5, pp. 835-848, 1971.

Kudekar, S. et al., "Enhanced polar code constructions by strategic placement of crc bits," U.S. Appl. No. 15/395,713, filed 2017.

Niu, K. et al., "CRC-aided decoding of polar codes" IEEE Communications Letters, vol. 16, No. 10, pp. 1668-1671, 2012.

Sarkis, G. et al., "Fast list decoders for polar codes," IEEE Journal on Selected Areas in Communications, vol. 34, No. 2, pp. 318-328, 2016.

Tal, I. et al., "List decoding of polar codes," IEEE Transactions on Information Theory, vol. 51, No. 5, pp. 2213-2225, 2015.

Trifonov, P. "Star polar subcodes," In Proceedings of IEEE Wireless Communications and Networking Conference, Mar. 2017.

Vardy, A. et al., "How to construct polar codes," IEEE Transactions on Information Theory, vol. 59, No. 10, pp. 6562-6582, 2013.

Viterbi, A. "Error bounds for convolutional codes and an asymptotically optimum decoding algorithm," IEEE Transactions on Information Theory, vol. 13, No. 2, pp. 260-269, 1967.

ISA, International Search Report and Written Opinion for International Patent Application No. PCT/US2020/035936, dated Aug. 18, 2020. 7 pages.

Wang et al. "Interleaved Concatenations of Polar Codes With BCH and Convolutional Codes" IEEE Journal on Selected Areas in Communications, vol. 34, No. 2, Feb. 2016. pp. 267-277.

\* cited by examiner

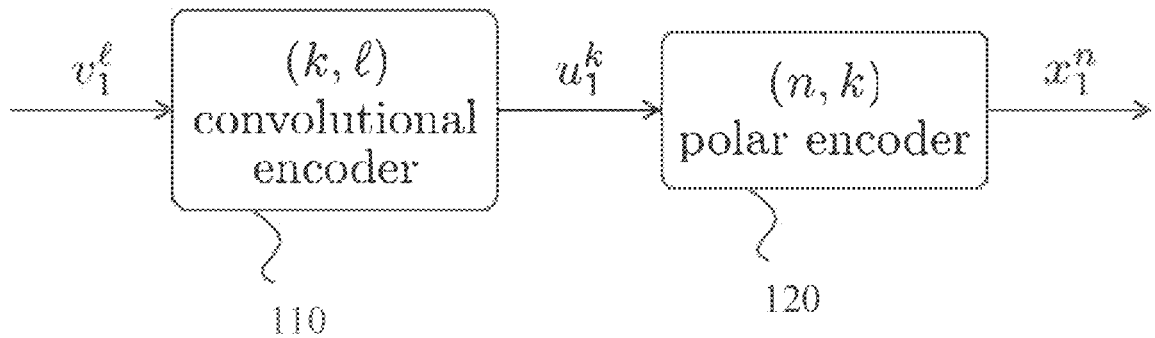

FIG. 1

Input: length-$k$ vector $\mathbf{q} \in \mathbb{R}^k$ of noise levels
Output: a length-$2\ell$ puncturing pattern vector $\mathbf{c}$ 1  set $\beta \leftarrow 0$ and $\gamma \leftarrow \sum_{j=1}^{k} q_j$
2  set $t \leftarrow r$ and $i \leftarrow 1$ // $r = \ell - k$
3  while $i \leq k$ do
4     if $\beta + q_i + q_{i+1} \geq \mathcal{Q}/t$ then
      // assign a non-punctured symbol
5        set $c_{2i-2(r-t)-1} \leftarrow 0$ and $c_{2i-2(r-t)} \leftarrow 0$
      // empty the bucket
6        set $\beta \leftarrow 0$ and $\gamma \leftarrow \sum_{j=i+2}^{k} q_j$
      // go to next symbol
7        set $t \leftarrow t - 1$ and $i \leftarrow i + 2$
8     else
      // assign a punctured symbol
9        set $c_{2i-2(r-t)-1} \leftarrow 1$ and $c_{2i-2(r-t)} \leftarrow 0$
      // fill the bucket
10       set $\beta \leftarrow \beta + q_i$
      // go to next symbol
11       set $i \leftarrow i + 1$
12 return $\mathbf{c}$

FIG. 2

CONVOLUTIONAL PRECODING AND DECODING OF POLAR CODES

CROSS-REFERENCE TO RELATED APPLICATION

This patent document is a divisional of U.S. patent application Ser. No. 16/892,068 entitled "CONVOLUTIONAL PRECODING AND DECODING OF POLAR CODES" and filed on Jun. 3, 2020, which claims priority to and benefits of U.S. Provisional Patent Application No. 62/856,646 entitled "CONVOLUTIONAL PRECODING AND DECODING OF POLAR CODES" and filed on Jun. 3, 2019. The entire contents of the aforementioned patent applications is incorporated by reference as part of the disclosure of this patent document.

TECHNICAL FIELD

This document generally relates to error correction codes, and more particularly to convolutional precoding and decoding of polar codes.

BACKGROUND

A communications system generally adopts channel encoding to improve reliability of data transmission and ensure quality of communications in the presence of various types of noise and errors. Polar coding is a general and extremely powerful error-correction technology proposed around a decade ago, and which is currently used for coding the control channels in the eMBB mode of the Fifth Generation (5G) wireless standard. In addition to wireless communications, polar codes may have applications in fiber-optic networks, data storage, satellite communications, and more.

SUMMARY

Embodiments of the disclosed technology relate to methods, systems and devices for the convolutional precoding and decoding of polar codes that can be used in various communication systems, including but not limited to wireless systems, wired systems, and data storage systems. The described embodiments advantageously enable the exchange of voice, video, data, and other information with lower implementation complexity and better error correction capabilities, thereby supporting high-date rates in high-mobility environments.

In an example aspect, a method for improving an error correction capability of a decoder includes receiving a noisy codeword, the codeword having been generated based on an outer stream decodable code and an inner polar code and provided to a communication channel or a storage channel prior to reception by the decoder, the stream decodable code characterized by a trellis, and performing, based on the trellis, a list-decoding operation on the noisy codeword vector to generate a plurality of information symbols, the list-decoding operation being configured to traverse through a plurality of states at one or more stages of a plurality of decoding stages, wherein an i-th symbol of any noisy codeword of the outer stream decodable code could be decoded to a valid symbol based on a first i+w symbols of the noisy codeword, wherein each codeword of the outer stream decodable code has a length of n symbols, with n>i+w, and wherein n, i, and w are positive integers.

In another example aspect, a method for improving an error correction capability of an encoder includes receiving a plurality of information symbols, generating a plurality of convolutionally encoded symbols by performing a convolutional encoding operation on the plurality of information symbols, wherein the convolutional encoding operation is based on a time-varying trellis, generating a plurality of polar encoded symbols by performing a polar encoding operation on the plurality of convolutionally encoded symbols, and providing the plurality of polar encoded symbols for transmission or storage.

In yet another example aspect, the above-described methods may be implemented by an apparatus or device that comprises a processor and/or memory.

In yet another example aspect, these methods may be embodied in the form of processor-executable instructions and stored on a computer-readable program medium.

The subject matter described in this patent document can be implemented in specific ways that provide one or more of the following features.

BRIEF DESCRIPTION OF THE DRAWINGS

FIG. 1 illustrates an example of the convolutional precoding of polar codes.

FIG. 2 illustrates an example of an algorithm that generates a puncturing pattern.

DETAILED DESCRIPTION

Figure 3:
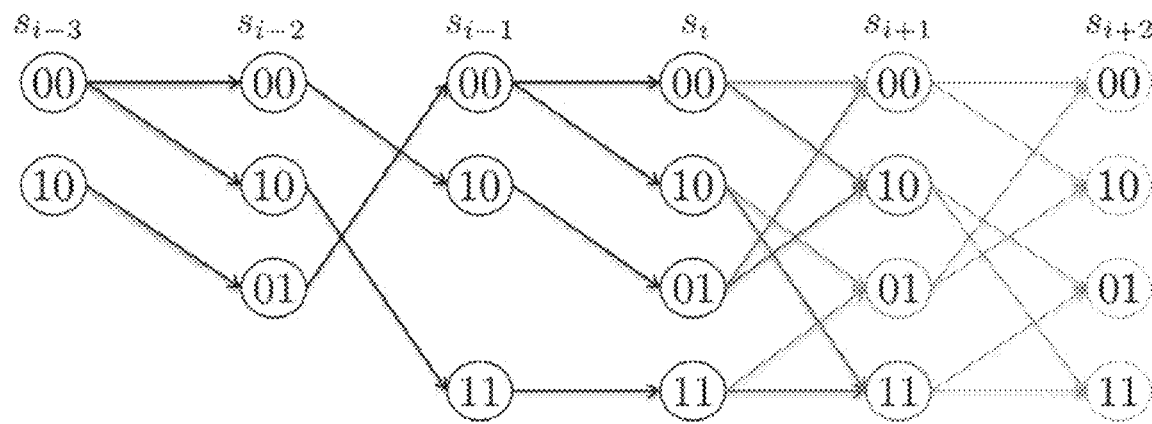
FIG. 3 illustrates an example of a convolutional list successive cancellation decoder.

Polar codes are a new approach to maximizing the rate and reliability of data transmissions. In an example, polar codes have been adopted to improve coding performance for control channels in 5G. At the same time, they reduce the complexity of design and ensure service quality. Polar codes are a type of linear block error correcting code, whose code construction is based on a multiple recursive concatenation of a short kernel code which transforms the physical channel into virtual outer channels. When the number of recursive concatenations becomes large, the virtual channels tend to either have very high reliability or very low reliability (in other words, they polarize), and the data bits are allocated to the most reliable channels.

Embodiments of the disclosed technology relate to convolutional precoding and decoding of polar codes that among other features and benefits reduce a communication receiver's complexity while realizing the potential of the performance of polar codes. The disclosed embodiments can, for example, be used to reduce the required list size in list successive cancellation (LSC) (or successive-cancellation list (SCL)) decoding of polar codes, which in turn reduces the overall computational complexity of the decoder. Simulation results indicate that a reduction of at least 50 percent in list sizes can be achieved. In example embodiments, the precoding is designed based on a time-varying puncturing pattern of convolutional codes that provides a balanced error correction over unfrozen polarized bit-channels, which are also known as unfrozen synthesized channels.

Section headings are used in the present document to improve readability of the description and do not in any way limit the discussion or embodiments (and/or implementations) to the respective sections only. Accordingly, embodiments disclosed in different sections can be used with each other.

Introduction to Polar Codes and List Successive Cancellation List (LSC) Decoding Polar Codes.

In the present document, embodiments of the disclosed technology use a (n, k) polar encoder, where $n=2^m$ corresponds to m levels of polarization and k denotes the number of information bits in the polar code, resulting in n–k frozen bits. In some embodiments, the frozen bits are set to zero. In other embodiments, the frozen bits are computed dynamically. In yet other embodiments, the frozen bits are computed such that they are known a priori at both the transmitter and the receiver. The relationship between the transmitted symbols $\{x_i\}$ and the uncoded information bits $\{u_i\}$ is given by:

$$x = uG_n,$$
$$G_n = B_n \begin{bmatrix} 1 & 0 \\ 1 & 1 \end{bmatrix}^{\otimes m}.$$

Herein, $x=uG_n$ is referred to as a polar transformation, and $G_n$ is the polar code generator (or generating) matrix. In some embodiments, the polar code generator matrix is the m-th Kronecker power of the 2×2 kernel matrix that is multiplied by a length-n bit reversal matrix $B_n$ and u denotes the uncoded information bit vector that includes k information bits and n–k frozen bits. In an example, the 2×2 kernel matrix (denoted F) and the m-th Kronecker power of the kernel matrix for m=3 are given by:

$$F = \begin{bmatrix} 1 & 0 \\ 1 & 1 \end{bmatrix},$$

$$\text{and } F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

In some embodiments, different 2×2 kernel matrices $$\left(\text{e.g., } \begin{bmatrix} 1 & 1 \\ 1 & 0 \end{bmatrix}\right)$$

may be used to generate the polar code. In other embodiments, a N×N kernel matrix may be used to generate the polar code, where N>2. In yet other embodiments, the bit reversal matrix $B_n$ may be omitted in the generation of the polar code.

List Successive Cancellation Decoding.

List successive cancellation (LSC) decoding of polar codes is typically performed during decoding at the receiver, and operates by generating L codeword candidates where L is called the list size. The value of L determines the trade-off between error-correcting performance and the computational complexity.

When list successive cancellation decoding is performed, at each stage of the decoding process, the list of L survivor candidates is maintained. For example, during list successive cancellation decoding, at each stage, the previous decoded values are used to decode the current value. During decoding, if a bit value is not known, an LSC decoder first assumes that the value is "0" and then "1," and performs the decoding operation for both cases. The number of assumptions that can be made during the decoding process corresponds to the list size L. It has been shown that LSC decoding approaches maximum likelihood (ML) decoding for moderate list sizes. In some existing implementations, and to match the performance of Turbo and LDPC codes, for example, a cyclic redundancy check (CRC) code is serially concatenated with the polar codes and the CRC bits are used to choose the valid codeword from the candidates of the LSC decoder, albeit at the expense of greater complexity. CRC checkpoints provide some auxiliary information that can help the decoder detect a few mistakes it may have made throughout the decoding process.

Overview of Convolutional Precoding and Decoding of Polar Codes

Embodiments of the disclosed technology replace the CRC with a convolutional code to advantageously provide a continuous and purposefully-unequal layer of protection to all of the information rather than one or a few checkpoints. In contrast to the CRC that is only capable of validating an entire or a large segment of the information vector, which gives little to no information about the location of the decoding mistake and forces the decoder to guess the location based on statistical knowledge, a convolutional code provides an exact location for the mismatched symbol. The use of convolutional codes does not necessarily increase the minimum distance, but provides a local error correction capability on the go. In this document, an error correction code that provides this on-the-go local error correction capability (including, but not limited to, the convolutional code described herein) is referred to as a "stream decodable code."

The convolutional code works as an additional layer of protection over polar information bits. Since many of the information bits associated with polar bit-channels that are essentially noise-free and hence do not require further protection, which is a result of channel polarization, embodiments of the disclosed technology provide puncturing patterns over the systematic convolutional code to avoid overprotection, thereby increasing the overall code rate.

Furthermore, convolutional precoding and decoding of polar codes advantageously enables reaching the desired decoding error probability with smaller list sizes in the successive cancellation decoding algorithm of polar codes, which translates to lower computational complexity for the decoder. Lower computational complexity translates to smaller chip size, higher throughput, and less power consumption in wireless communication.

Examples of Encoding Structures for Embodiments of the Disclosed Technology

FIG. 1 illustrates an example of a concatenation scheme between an (n, k) polar code (120) and a high-rate (k, $\ell$) convolutional code (110), with the overall rate being given by $\ell/n$. In some embodiments, the high-rate convolutional code is be generated in at least two ways:

(1) a higher-complexity convolutional code with large number of states that has a large mother code-rate; or
(2) a lower-complexity convolutional code with a moderate number of states and a time-varying puncturing pattern.

According to embodiments of the disclosed technology, the convolutional code provides a local error correction capability on the go, and is configured to have a small decoding delay. The decoding delay in convolutional codes is linked to their traceback depth parameter, which is itself linked with the constraint length of the code. In an example, the traceback depth of a convolutional code with mother code-rate ½ can be estimated as five times its constraint length. In another example, the traceback depth may be greater for heavily punctured convolutional codes.

In an example, the generator matrix of a rate-½ mother convolutional code is denoted $G_{conv}=[1+D^2, 1+D+D^2]$. The encoder prior to the puncturing can be described as:

$$u_{2i-1} = v_i + v_{i-2}$$

$$u_{2i} = v_i + v_{i-1} + v_{i-2}.$$

Herein, i=1, 2, ..., l, and $v_0 = v_{-1} = 0$. Hence, the additional encoding complexity is linear in block-length which does not increase the overall asymptotic complexity of O(n log n). In this framework, the structure of the convolutional polar decoder does require termination of the convolutional code. Thus, the mother convolutional code can be viewed as a $(2\ell, \ell)$ linear block code, where the value of $\ell$ is determined according to the extra redundancy associated with the convolutional precoding, $r = \ell - k$.

The high-rate convolutional code illustrated in FIG. 1 can be generated by puncturing some $2\ell - k$ coordinates on the mother code. If it is assumed that the i-th convolutional symbol is denoted $(u_{2i-1}, u_{2i})$, then it is intuitively clear that a convolutional code whose i-th symbol is not punctured at all provides a better local correction around the i-th symbol than the same convolutional code with one or both bits in its i-th symbol punctured. Based on this approach, the disclosed puncturing algorithm punctures a bit in all but $\ell - k$ symbols where the non-punctured symbols appear around more noisy bit-channels.

An Example of a Puncturing Algorithm

According to some embodiments of the disclosed technology, a method to design a time-varying puncturing pattern for convolutional codes is beneficial in scenarios where the underlying transmission channel is time-varying or unequal error protection is desired. For example, the non-periodic puncturing pattern for convolutional codes that is designed can be used to balance out the bit error probabilities of a time-varying underlying communication channel. This is based on partitioning different instances of the communication channel into subgroups with almost equal accumulated errors in each and then assigning an equal number of redundancy bits to each subset.

In some embodiments, the bit-channels can be partitioned into r subsets $S_i$ for i=1, ... r while preserving their order, which results in all bit-channels in set i appearing before the bit-channels in set j during the SC decoding for all i≤j. Furthermore, the noise is balanced such that the probability of making a mistake in each group is roughly the same. These probabilities can be formulated by $$\prod_{j \in S_i} (1 - p_j).$$

The algorithm starts with an empty subset, and bit-channels are added one by one to the subset while assigning a punctured symbol to each until the overall error probability of the bit-channels inside the subset reaches the rough threshold of $$\left( \prod_{i=1}^{k} (1 - p_i) \right)^{1/r}.$$

When this threshold is reached, a non-punctured symbol is assigned instead. The algorithm then proceeds to the next partition similarly. Thus, each partition ends up with exactly one non-punctured symbol, which is the additional parity that is there to provide a local error correction throughout the SC decoding. In other embodiments, more than one additional parity is assigned to each partition.

FIG. 2 illustrates an example implementation for generating the puncturing pattern, wherein the noise levels are given by $q_j = -\log(1 - p_j)$. As illustrated therein, the output of the algorithm is a binary vector c of length $2\ell$ that corresponds to the puncturing pattern on the length $2\ell$ convolutional code, where $c_i = 1$ when the i-th bit is punctured. In this example, numerical simulations suggest puncturing the first bit rather than the second one in the convolutional symbols (see line 9 in FIG. 2).

In some embodiments, the time-varying puncturing patterns can be used to improve the performance of a hybrid ARQ (automatic repeat request) scheme that uses incremental redundancy (IR) in a time-varying transmission channel. Upon determining that a transmission has not been successfully decoded at the receiver, an IR-HARQ scheme typically transmits different sets (and/or an increasing number) of parity bits in subsequent re-transmissions to improve the received SNR. Different redundancy versions of the output of the encoder (of a low-rate mother code) may be generated using the time-varying puncturing patterns.

In some embodiments, the time-varying puncturing patterns may be used to improve the performance of rate-adaptive coding and modulation schemes. In this framework, the channel is periodically evaluated at a receiver and an estimate (prediction) of the future channel state is sent back to a transmitter on a separate channel. Thus, the transmitter adapts to the instantaneous channel quality by choosing between different available transmission schemes of varying spectral efficiencies, which may be designed using the time-varying puncturing patterns as described in this document.

In some embodiments, the time-varying puncturing patterns may be used to provide unequal error protection (UEP), which is frequently used in integrated voice and data transmission over band-limited channels. For example, recent source coding techniques (e.g., code-excited linear prediction) can provide good quality speech but some of the source coder output bits are more sensitive to transmission errors than others. The time-varying puncturing patterns described in this document are well suited for this application. UEP exploits the fact that less noisy bit-channels require less secondary protection. Thus, equalizing the error levels of the unfrozen polar bit-channels improves the frame error rate (FER) significantly.

Example of Decoding Structures for Embodiments of the Disclosed Technology

According to embodiments of the disclosed technology, the convolutional code (e.g., 110 in FIG. 1) is not used just to verify the output of the successive cancellation decoder (as is the case when using the concatenated CRC code). Instead, the convolutional code is used to modify the decoding algorithms to only follow those paths that correspond to the valid convolutional codewords. Therefore, there are no checkpoints in this algorithm and the secondary error detection mechanisms are replaced with an error prevention scheme. Moreover, the performance enhancement is provided in a more balanced way among the bit-channels than the checkpoints in the CRC-aided scheme.

Thus, the proposed decoding algorithms, during the list successive cancellation decoding, keep track of the valid codewords over the trellis that corresponds to the underlying convolutional code. By doing so, the decoder only explores codewords that are validated on the go and hence prevents unnecessary calculations.

In an example, assume a (16, 8) polar code has unfrozen indices $\{i_1, \ldots, i_8\}$, and which has been precoded with a (12, 6) convolutional code that is punctured at indices $\{1, 3, 7, 9\}$. The convolutional SC decoder reveals polar non-frozen bits in the following ordered batches:

$$\hat{u}_{i_1} \to \hat{u}_{i_2} \to \{\hat{u}_{i_3}, \hat{u}_{i_4}\} \to \hat{u}_{i_5} \to \hat{u}_{i_6} \to \{\hat{u}_{i_7}, \hat{u}_{i_8}\}.$$

Although it is possible to implement a convolutional SC decoder, one of the main advantages, amongst others, of precoding with a convolutional code appears in the convolutional LSC decoder. There are typically two general methods to implement a list decoder that tracks paths on the trellis of the convolutional code, which differ only in their pruning methods. Assume the list size is given by L. The first implementation of the convolutional LSC decoder performs sequential decoding over the trellis while tracking the L most likely paths ending at the same symbol slot. At each step, it generates 2 L new paths, of which L most likely ones are selected for the decoding step that follows.

In the second method, the list size L is fixed and equal to the maximum number of states in the encoder. This is typically given by $2^v$, where v is the number of memory elements. Here, the decoder tracks the L more likely paths, where each path ends in a different state. In each iteration of the decoder, 2 L new paths are generated, which give two different options to choose from for the paths ending in each state, and wherein the less likely one is discarded. This resembles the Viterbi Algorithm of convolutional codes as depicted in the example in FIG. 3. As illustrated therein, for symbol $s_{i+1}$, each of the 4 paths ends in a different state, and 8 new paths are computed using the convolutional LSC decoder. For each state in symbol $s_{i+1}$, the more likely path among the two options is kept and the other one is discarded.

Figure 4:
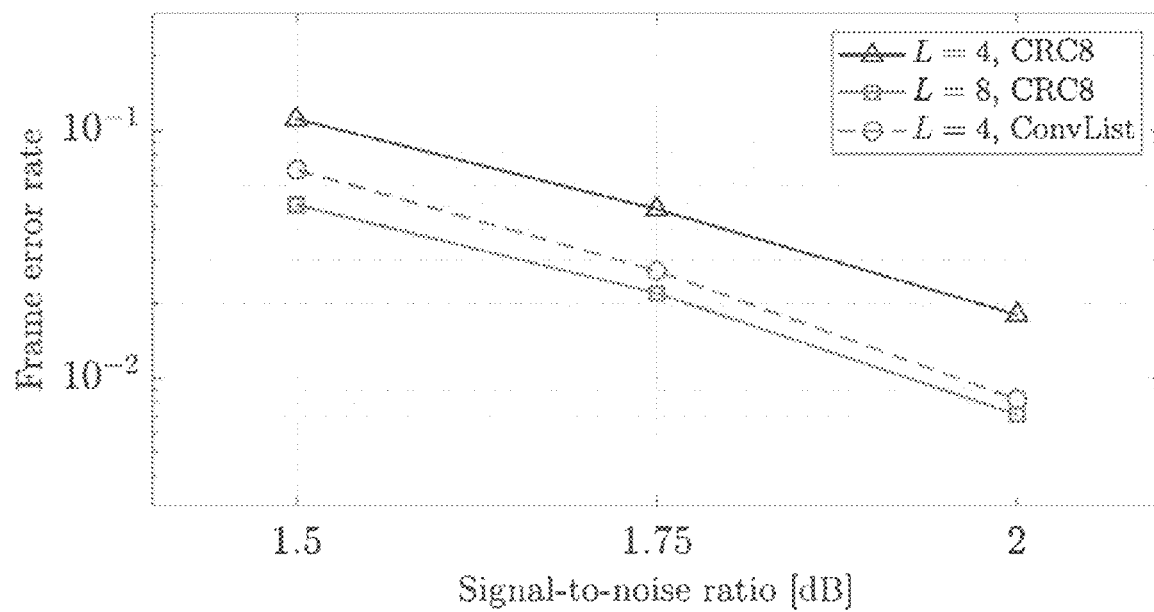
FIG. 4 compares the frame error rate (FER) performance of cyclic redundancy check (CRC)-aided list successive cancellation (LSC) decoding and convolutional LSC decoding.

Numerical simulations suggest that the second method is more efficient in some embodiments, since keeping track of decoding path endings in different states provides a form of diversity that helps with the recovery of the correct path if it diverges from the ML path through decoding. FIG. 4 compares the frame error rate (FER) performance of CRC-aided LSC decoding and convolutional LSC decoding. In this example, the polar code is has length n=512 and rate ½, the last 8 information bits are used for the CRC (in the CRC-aided LSC decoding) and 8 non-punctured symbols are selected based on the puncturing algorithm described earlier (in the convolutional LSC decoding). As illustrated therein, convolutional LSC decoding outperforms CRC-aided LSC decoding with the same L (e.g., L=4 in FIG. 4), and is marginally worse than CRC-aided LSC decoding with double the list size (e.g., L=8 in FIG. 4).

Computational Complexity

The computational complexity of tracking the codewords over the trellis is linear in block-length. The computational complexity of the convolutional LSC decoder is dictated by the list size or equivalently by the number of states in the convolutional encoder, which can be represented as O ($2^v$n log n). In an example wherein a strong convolutional code may be used, a larger number of states may be present, which necessitates either increasing the list size or using a sub-optimal decoder.

Methods and Implementations of the Disclosed Technology

Figure 5:
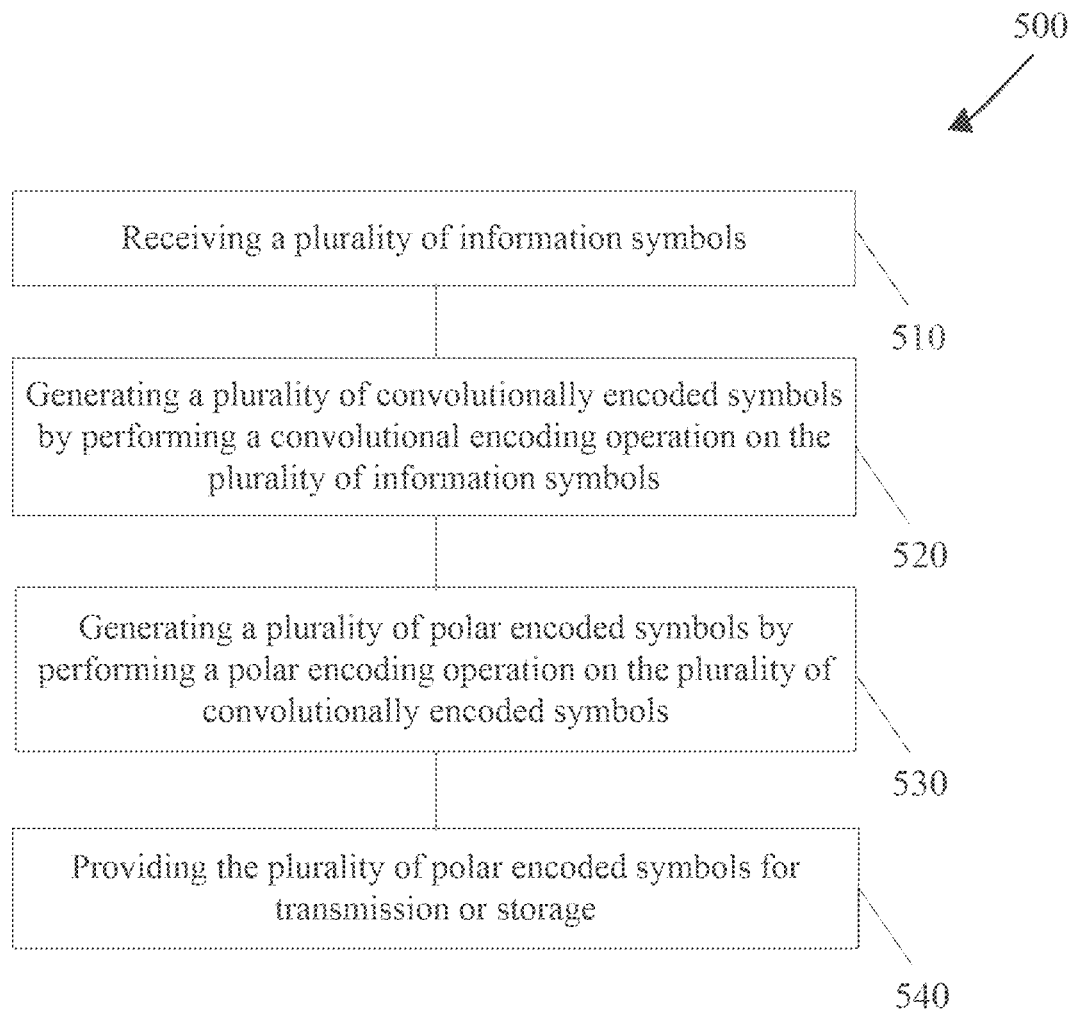
FIG. 5 is a flowchart of an example method for convolutional LSC encoding.

FIG. 5 is a flowchart for improving an error correction capability of a encoder. The method 500 includes, at operation 510, receiving a plurality of information symbols.

The method 500 includes, at operation 520, generating a plurality of convolutionally encoded symbols by performing a convolutional encoding operation on the plurality of information symbols (e.g., block 110 in FIG. 1), wherein the convolutional encoding operation is based on a time-varying trellis. In some embodiments, the time-varying trellis includes a different number of outgoing branches from each state at different times. In other embodiments, the time-varying trellis includes a different number of states at each decoding stage and/or time.

The method 500 includes, at operation 530, generating a plurality of polar encoded symbols by performing a polar encoding operation (e.g., block 120 in FIG. 1) on the plurality of convolutionally encoded symbols.

The method 500 includes, at operation 540, providing the plurality of polar encoded symbols for transmission or storage.

Figure 6:
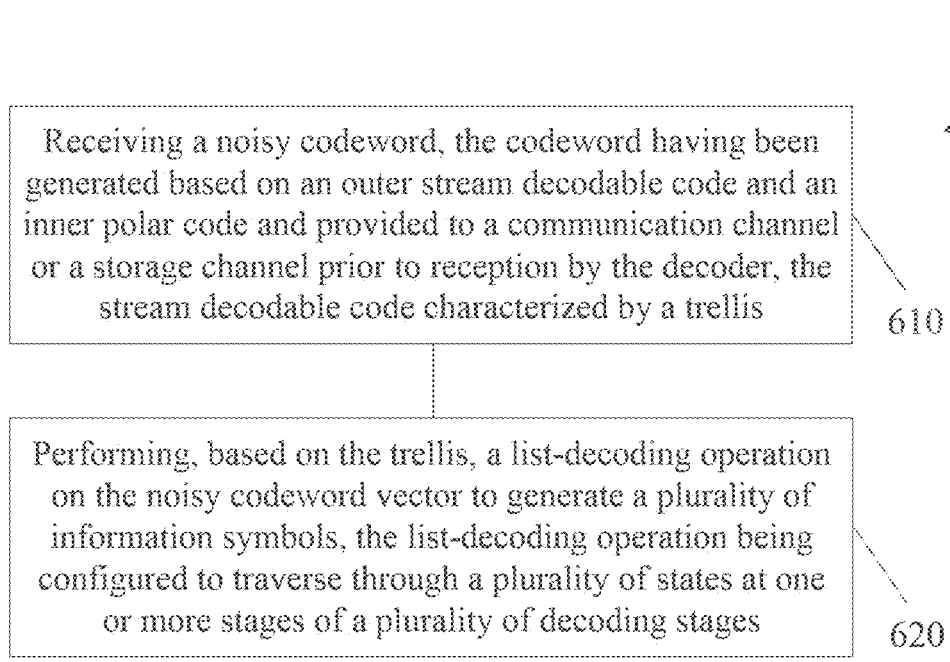
FIG. 6 is a flowchart of an example method for convolutional LSC decoding.

FIG. 6 is a flowchart for improving an error correction capability of an decoder. The method 600 includes, at operation 610, receiving a noisy codeword, the codeword having been generated based on an outer stream decodable code and an inner polar code and provided to a communication channel or a storage channel prior to reception by the decoder, the stream decodable code characterized by a trellis. In an example, FIG. 1 illustrates the concatenated code that includes the outer stream decodable code (110) and the inner polar code (120).

The method 600 includes, at operation 620, performing, based on the trellis, a list-decoding operation on the noisy codeword vector to generate a plurality of information symbols, the list-decoding operation being configured to traverse through a plurality of states at one or more stages of a plurality of decoding stages.

In some embodiments, an i-th symbol of any noisy codeword of the outer stream decodable code could be decoded to a valid symbol based on a first i+w symbols of the noisy codeword, wherein each codeword of the outer stream decodable code has a length of n symbols, with n>i+w, and wherein n, i, and w are positive integers. In an example, and as illustrated in FIG. 1, the outer stream decodable code may be a convolutional code, and w may be configured to be five times the constraint length of the convolutional code.

In some embodiments, the stream decodable code is a convolutional code.

In some embodiments, w=5×K, wherein K is a constraint length of the convolutional code, and wherein K is a positive integer.

In some embodiments, the convolutional code is a high-rate convolutional code with a code rate greater than ½.

In some embodiments, the high-rate convolutional code is generated by applying a time-varying puncturing pattern to a low-rate convolutional code with a code rate ≤ ½.

In some embodiments, the method 600 further includes the operation of configuring the list-decoding operation to traverse a single most probable path at each state at each stage.

In some embodiments, the method 600 further includes the operation of configuring the list-decoding operation to track L most likely paths at each stage, wherein L is a list-size of the list-decoding operation.

In some embodiments, the polar encoding operation comprises multiplying an output of the encoding operation for the stream decodable code by a generator matrix (G).

In some embodiments, the generator matrix is defined as $$G = B \begin{bmatrix} 1 & 0 \\ 1 & 1 \end{bmatrix}^{\otimes m}$$

Herein, ⊗ denotes a Kronecker product, B is an n×n bit-reversal permutation matrix, n=$2^m$ is a length of the polar code, and m and n are integers.

In some embodiments, the trellis is a time-varying trellis. In an example, a convolutional code with a time-varying trellis may be used to better balance out the secondary error protection over the unfrozen bit-channels of a polar code.

In some embodiments, the trellis is a time-invariant trellis.

Figure 7:
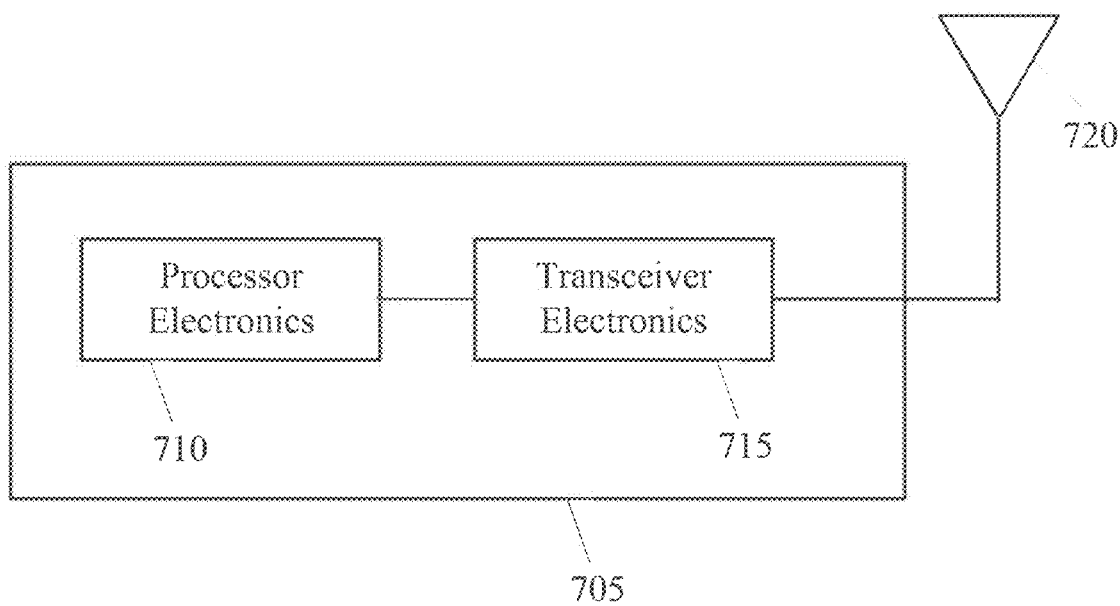
FIG. 7 is a block diagram representation of a portion of an apparatus, in accordance with some embodiments of the presently disclosed technology.

FIG. 7 is a block diagram representation of a portion of an apparatus that can accommodate some embodiments of the presently disclosed technology. An apparatus 705, such as a base station or a wireless device (or UE), can include processor electronics 710 such as a microprocessor that implements one or more of the techniques (including, but not limited to, methods 500 and 600) presented in this document. The apparatus 705 can include transceiver electronics 715 to send and/or receive wireless signals over one or more communication interfaces such as antenna(s) 720. The apparatus 705 can include other communication interfaces for transmitting and receiving data. Apparatus 705 can include one or more memories (not explicitly shown) configured to store information such as data and/or instructions. In some implementations, the processor electronics 710 can include at least a portion of the transceiver electronics 715. In some embodiments, at least some of the disclosed techniques, modules or functions are implemented using the apparatus 705. In some embodiments, the disclosed technology can be implemented as part of a computer system (e.g., a personal computer, a smartphone, a tablet or the like) to enable improved access to data stored on a memory device associated with the computer system. The disclosed embodiments provide enhanced error correction capabilities, which improve the reliability of data stored and accessed in the computer system; at the same time, these enhancements are achieved by reduced computational complexity of the operations compared to existing techniques.

It is understood that the various disclosed embodiments may be implemented individually, or collectively, in devices comprised of various components, electronics hardware and/or software modules and components. These devices, for example, may comprise a processor, a memory unit, an interface that are communicatively connected to each other, and may range from desktop and/or laptop computers, to mobile devices and the like. The processor and/or controller can perform various disclosed operations based on execution of program code that is stored on a storage medium. The processor and/or controller can, for example, be in communication with at least one memory and with at least one communication unit that enables the exchange of data and information, directly or indirectly, through the communication link with other entities, devices and networks. The communication unit may provide wired and/or wireless communication capabilities in accordance with one or more communication protocols, and therefore it may comprise the proper transmitter/receiver antennas, circuitry and ports, as well as the encoding/decoding capabilities that may be necessary for proper transmission and/or reception of data and other information.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., FPGA (field programmable gate array) or ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving an error correction capability of an encoder, comprising:
   receiving a plurality of information symbols;
   generating a plurality of convolutionally encoded symbols by performing a convolutional encoding operation on the plurality of information symbols, wherein the convolutional encoding operation is based on a time-varying trellis;
   generating a plurality of polar encoded symbols by performing a polar encoding operation on the plurality of convolutionally encoded symbols; and
   providing the plurality of polar encoded symbols for transmission or storage.

2. The method of claim 1, wherein the convolutional encoding operation uses a high-rate convolutional code with a code rate greater than $\frac{1}{2}$.

3. The method of claim 2, wherein the high-rate convolutional code is generated by applying a time-varying puncturing pattern to a low-rate convolutional code with a code rate less than or equal to $\frac{1}{2}$.

4. The method of claim 1, wherein the polar encoding operation uses a polar code and comprises multiplying the plurality of convolutionally encoded symbols by a generator matrix (G).

5. The method of claim 4, wherein the generator matrix is defined as $$G = B \begin{bmatrix} 1 & 0 \\ 1 & 1 \end{bmatrix}^{\otimes m}$$

wherein $\otimes$ denotes a Kronecker product, wherein B is an n×n bit-reversal permutation matrix, wherein $n=2^m$ is a length of the polar code, and wherein m and n are integers.

6. The method of claim 1, wherein the convolutional encoding operation uses a convolutional code characterized by a trellis.

7. The method of claim 6, wherein the trellis is a time-varying trellis.

8. The method of claim 6, wherein the trellis is a time-invariant trellis.

9. The method of claim 1, wherein the convolutional encoding operation uses a convolutional code with mother code-rate $\frac{1}{2}$, and wherein a traceback depth of the convolutional code is equal to five times a constraint length of the convolutional code.

10. A device for improving an error correction capability of an encoder, comprising:
    a processor; and
    a non-transitory memory including instructions stored thereon, wherein the instructions upon execution by the processor cause the processor to:
    receive a plurality of information symbols;
    generate a plurality of convolutionally encoded symbols by performing a convolutional encoding operation on the plurality of information symbols, wherein the convolutional encoding operation is based on a time-varying trellis;
    generate a plurality of polar encoded symbols by performing a polar encoding operation on the plurality of convolutionally encoded symbols; and
    provide the plurality of polar encoded symbols for transmission or storage.

11. The device of claim 10, wherein the convolutional encoding operation uses a high-rate convolutional code with a code rate greater than $\frac{1}{2}$, and wherein the high-rate convolutional code is generated by applying a time-varying puncturing pattern to a low-rate convolutional code with a code rate less than or equal to $\frac{1}{2}$.

12. The device of claim 10, wherein the polar encoding operation uses a polar code and comprises multiplying the plurality of convolutionally encoded symbols by a generator matrix (G).

13. The device of claim 12, wherein the generator matrix is defined as $$G = B \begin{bmatrix} 1 & 0 \\ 1 & 1 \end{bmatrix}^{\otimes m}$$

wherein ⊗ denotes a Kronecker product, wherein B is an n×n bit-reversal permutation matrix, wherein n=2$^m$ is a length of the polar code, and wherein m and n are integers.

14. The device of claim 10, wherein the convolutional encoding operation uses a convolutional code characterized by a trellis, and wherein the trellis is either a time-varying trellis or a time-invariant trellis.

15. The device of claim 10, wherein the convolutional encoding operation uses a convolutional code with mother code-rate ½, and wherein a traceback depth of the convolutional code is equal to five times a constraint length of the convolutional code.

16. A non-transitory computer-readable storage medium having instructions stored thereupon for improving an error correction capability of an encoder, comprising:
   instructions for receiving a plurality of information symbols;
   instructions for generating a plurality of convolutionally encoded symbols by performing a convolutional encoding operation on the plurality of information symbols, wherein the convolutional encoding operation is based on a time-varying trellis;
   instructions for generating a plurality of polar encoded symbols by performing a polar encoding operation on the plurality of convolutionally encoded symbols; and
   instructions for providing the plurality of polar encoded symbols for transmission or storage.

17. The computer-readable storage medium of claim 16, wherein the convolutional encoding operation uses a high-rate convolutional code with a code rate greater than ½.

18. The computer-readable storage medium of claim 17, wherein the high-rate convolutional code is generated by applying a time-varying puncturing pattern to a low-rate convolutional code with a code rate less than or equal to ½.

19. The computer-readable storage medium of claim 16, wherein the polar encoding operation uses a polar code and comprises multiplying the plurality of convolutionally encoded symbols by a generator matrix (G).

20. The computer-readable storage medium of claim 19, wherein the generator matrix is defined as $$G = B \begin{bmatrix} 1 & 0 \\ 1 & 1 \end{bmatrix}^{\otimes m}$$

wherein ⊗ denotes a Kronecker product, wherein B is an n×n bit-reversal permutation matrix, wherein n=2$^m$ is a length of the polar code, and wherein m and n are integers.

* * * * *